(12) United States Patent
Hirose (10) Patent No.: US 10,538,691 B2
(45) Date of Patent: Jan. 21, 2020

(54) EXPANDED-GRAPHITE SHEET

(71) Applicant: Toyo Tanso Co., Ltd., Mitoyo-gun, Kagawa (JP)

(72) Inventor: Yoshiaki Hirose, Mitoyo-gun (JP)

(73) Assignee: Toyo Tanso Co., Ltd., Osaka (JP)

( * ) Notice: Subject to any disclaimer, the term of this patent is extended or adjusted under 35 U.S.C. 154(b) by 69 days.

(21) Appl. No.: 15/400,822

(22) Filed: Jan. 6, 2017

(65) Prior Publication Data

US 2017/0174519 A1    Jun. 22, 2017

Related U.S. Application Data

(63) Continuation of application No. 10/575,554, filed as application No. PCT/JP2005/012733 on Jul. 11, 2005, now abandoned.

(30) Foreign Application Priority Data

Aug. 27, 2004    (JP) ................................. 2004-249137

(51) Int. Cl.
| C09K 5/14 | (2006.01) |
| H05K 7/20 | (2006.01) |
| H05K 9/00 | (2006.01) |

(52) U.S. Cl.
CPC ............. *C09K 5/14* (2013.01); *H05K 7/2039* (2013.01); *H05K 9/0081* (2013.01);
(Continued)

(58) Field of Classification Search
None
See application file for complete search history.

(56) References Cited

U.S. PATENT DOCUMENTS

| 3,404,061 A | 1/1968 | Shane et al. |
| 3,494,382 A | 2/1970 | Shane et al. |

(Continued)

FOREIGN PATENT DOCUMENTS

| EP | 1783097 B1 | 1/2013 |
| JP | 60-118618 | 6/1985 |

(Continued)

OTHER PUBLICATIONS

Notice of Opposition to European Patent No. 1783097 (European Application No. 05765549.0), filed Oct. 16, 2013 • Evidence 1, the opposed patent, EP 1,783,097 B1; • Evidence 2, English translation of the original PCT claims • Evidence 3. Application as filed on entry to the European regional phase • Evidence 4, Computer print-out of the Opponent's sales of HS-400 material in 2004; • Evidence 5, eGrafTM HS-400 Heat Sink Material Datasheet (GrafTech International, 2002) • Evidence 6, An excerpt from the Opponent's laboratory notebooks relating to surface roughness data for the HS-400 material • Evidence 7, Excerpts from the Opponent's laboratory notebooks relating to thermal conductivity data for the HS-400 material obtained using the Angstrom method • Evidence 8. U.S. Pat. No. 3,494,382 (Shane, James H, et al) Feb. 10, 1970 • Evidence 9, Comparison of surface roughness produced by common production processes, (Degarmo, E. Paul, et aL) Figure 10-49, p. 228, "*Materials and Processes in Manufacturing*" (9th ed.), 2003, Wiley • Evidence 10, M. Bonnissel, et aL: "*Compacted exfoliated natural graphite as heat conduction medium*", Carbon, vaL 39 (2001) pp. 2151-2161 • Evidence 11, E. E. Marotta, et aL: "*The effect of interface pressure on thermal joint conductance for nexible graphite maten'als: Analytical and Experimental Study*", ITherm 2002—Eighth Intersociety Conference on Thermal and Thermomechanlcal Phenomena in Electronic Systems (2002) • Evidence 12, D.D.L. Chung: "*Flexible graphite for gasketing, adsorption, electromagnetic interference shielding, vibration damping, electrochemical applications, and stress sensing*", Journal of Materials Engineering and Performance, val 9, No. 2, (Apr. 2000), pp. 161-163 • Evidence 13. US 2004/0043220 A1 (Hirose Yoshiaki, et al.) Mar. 4, 2004.

(Continued)

| | rolling speed (m/min) | | | | | |
|---|---|---|---|---|---|---|
| | 1 | 2 | 4 | 6 | 8 | 10 |
| creases | no creases | no creases | creases | creases | creases | creases |
| surface roughness center line average height Ra (μm) | 2 | 3 | 5 | 6 | 6 | 6 |
| $\dfrac{\text{Max-Min}}{\text{Ave}} \times 100\ (\%)$ | 5 | 8 | 14 | 14 | 22 | 30 |

*Primary Examiner* — Guinever S Gregorio
(74) *Attorney, Agent, or Firm* — Rankin, Hill & Clark LLP (57) ABSTRACT

An expanded-graphite sheet whose thermal conductivity in its surfacewise directions is relatively uniform and higher than its thermal conductivity in its perpendicular direction can be produced efficiently at relatively low cost. Because the expanded-graphite sheet is made of expanded graphite alone and has thermal conductivity in parallel direction of 350 W/(m·K) or more, its thermal conductivity in parallel direction is much higher than its thermal conductivity in a perpendicular direction; therefore, it is suitable for the conduction and diffusion of heat. Besides, the expanded-graphite sheet can be produced easily, in a short time, efficiently, at relatively low cost.

23 Claims, 3 Drawing Sheets

(52) U.S. Cl.
CPC ...... *C01P 2006/10* (2013.01); *C01P 2006/32* (2013.01); *C01P 2006/80* (2013.01)

(56) References Cited

U.S. PATENT DOCUMENTS

| | | | |
|---|---|---|---|
| 4,247,496 | A | 1/1981 | Kawakami et al. |
| 2002/0166658 | A1 | 11/2002 | Norley et al. |
| 2002/0166660 | A1 | 11/2002 | Norley et al. |
| 2003/0044614 | A1 | 3/2003 | Norley et al. |
| 2003/0184696 | A1 | 10/2003 | Shimanuki et al. |
| 2004/0000391 | A1 | 1/2004 | Getz, Jr. et al. |
| 2004/0043200 | A1 | 3/2004 | Hirose et al. |
| 2004/0043220 | A1 | 3/2004 | Hirose et al. |
| 2005/0221938 | A1 | 10/2005 | Yoshida et al. |

FOREIGN PATENT DOCUMENTS

| | | |
|---|---|---|
| JP | 2566244 | 3/1986 |
| JP | 64-014139 | 1/1989 |
| JP | 01-167210 | 6/1989 |
| JP | 03-065505 | 3/1991 |
| JP | 03-153511 | 7/1991 |
| JP | 04-021509 | 1/1992 |
| JP | 06-134917 | 5/1994 |
| JP | 07-031546 | 2/1995 |
| JP | 08-188407 | 7/1996 |
| JP | 08-283011 | 10/1996 |
| JP | 08-319108 | 12/1996 |
| JP | 10-053407 | 2/1998 |
| JP | 10-175262 | 6/1998 |
| JP | 11-116220 | 4/1999 |
| JP | 11-204446 | 7/1999 |
| JP | 2000-016808 | 1/2000 |
| JP | 2000-173530 | 6/2000 |
| JP | 2001-079977 | 3/2001 |
| JP | 2002-012845 | 1/2002 |
| JP | 2002-033107 | 1/2002 |
| JP | 2002-265210 | 9/2002 |
| JP | 2002-265211 | 9/2002 |
| JP | 2003-105108 | 4/2003 |
| JP | 2003-171180 | 6/2003 |
| JP | 2003-297770 | 10/2003 |

OTHER PUBLICATIONS

Rebuttal to Opposition to European U.S. Pat. No. 1783097, (European Application No. 05765549.0), filed Jun. 10, 2014.
Summons to attend Oral procedures pursuant to Rule 115(1) EPC, European Patent Application No. 05765549.0, dated Mar. 3, 2015.
GrafTech International Holdings, Inc. Response to Opposition to European U.S. Patent No. 1783097, (European Application No. 05765549.0), dated Oct. 26, 2015.
Response to the Summons to attend Oral procedures pursuant to Rule 115(1) EPC, European Patent Application No. 05765549.0, dated Oct. 26, 2015.
Minutes of the oral proceedings, dated Nov. 26, 2015, before the Opposition Division for European Application No. 05765549.0.
Decision to Refuse the Opposition to European Patent No. 1783097 (European Application No. 05765549.0), dated Dec. 9, 2015.
Evidence 14, ASTM E1461-07, Standard Test Method for Thermal Diffusivity by the Flash Method, ASTM International, West Conshohocken, PA, 2007.
Evidence 15, ASTM C714-05, Standard Test Method for Thermal Diffusivity of Carbon and Graphite by Thermal Pulse Method, ASTM International, West Conshohocken, PA, 2005.
Evidence 16, ASTM E1225-09, Standard Test Method for Thermal Conductivity of Solids by Means of the Guarded-Comparative-Longitudinal Heat Flow Technique, ASTM International, West Conshohocken, PA, 2009.
Evidence 17, ASTM D5470-06, Standard Test Method for Thermal Transmission Properties of Thermally Conductive Electrical Insulation Materials, ASTM International, West Conshohocken, PA, 2006.
Evidence 18, Wagoner et al., "Angstrom's Method for Thermal Property Measurements of Carbon Fibers and Composites" Carbon Conference 1999, The American Carbon Society.
Evidence 19, R&D 100 Award Letter, dated Jul. 1, 2003.
Evidence 20, HS-400 Brochure, GrafTech, Advanced Energy Technology, Inc.
Evidence 24, Detailed 2004 Sales Data.
Evidence 25, Affidavit From John Wetula, dated Aug. 11, 2015.
Evidence 26, InterPACK 2003-35060 High Performance Cooling Jul. 6-11, 2003.
Evidence 27, eGraf Technical Bulletin 308, Jan. 2004.
Evidence 28, Surface roughness tests re E8 materials, dated Aug. 6, 2015.
Statement of Grounds of Appeal in Opposition again European Patent No. 1783097, dated Apr. 14, 2016 • Evidence 29, Further Affidavit of John Wetula, dated Apr. 8, 2016 • Evidence 30, Affidavit of Gary Mills, dated Apr. 8, 2016 • Evidence 31, Affidavit of Dr. Shaikh Shadab, dated Apr. 7, 2016 • Evidence 32, JIS B 0601-2001 Geometrical Product Specifications (GPS)—Surface texture: Profile method—Terms, definitions and surface texture parameters (Foreign Standard), 2 pages, (2001) • Evidence 33, Excerpt from JIS B 0021 (1984), Indications of Geometrical Tolerances on Drawing, Published by *Japanese Standards Association (JSA)*, (1984 Edition, Feb. 1, 1984), 2 pages, (referred to in Evidence 32) • Evidence 34, U.S. Pat. No. 4,247,496 (Kawakami et al.) Jan. 27, 1981, (referred to in Evidence 31) • Evidence 35, US 2005/0221938 A1 (Yoshida et al.) Oct. 6, 2005, (referred to in Evidence 31).
Reubuttal to Appeal No. T0287/16-3.3.05 dated Aug. 30, 2016.
Chung, D.D.L., "Electromagnetic interference shielding effectiveness of carbon materials," Carbon 39 (2001) 279-285. XP002561183.
Chung, D.D.L., "Flexible graphite for gasketing, adsorption, electromagnetic interference shielding, vibration damping, electrochemical applications, and stress sensing," JMEPEG (2000) 9:161-163, Apr. 2000. XP-002561182.
Japan Patent application No. 2004-249137, Examination Report dated Nov. 5, 2004.
Japan Patent application No. 2004-249137, Explanation presented by applicant to Japan Patent Office for early examination.
Kojima, A., et al., *Preparation of high functional wooden materials using graphite sheet*, Proceedings ofCabon Material Society, (1991) vol. 18, pp. 214-215, written in Japanese.
SG patent application No. 200606563.5, Australian Patent Office Written Opinion dated Feb. 21, 2007.
SG patent application No. 200606563.5, Australian Patent Office Written Opinion dated Oct. 3, 2007.
SG patent application No. 200606563.5, Response to Written Opinion dated Feb. 20, 2008.

(56) References Cited

OTHER PUBLICATIONS

SG patent application No. 200606563.5, Response to Written Opinion dated, Mar. 8, 2007.
Translation of JP 2000-016808.
Translation of JP 2003-29770, naming Kazuhiko et al., downloaded from the internet Apr. 11, 2015.
Documents, filed in Evidence on Jun. 19, 2017 • Evidence 14a, ASTM International Designation E1461-01, "Standard Test Method for Thermal Diffusivity by the Flash Method", (May 2001), 13 pages • Evidence 14b, ASTM International Designation E1461, "Standard Test Method for Thermal Diffusivity by the Flash Method", (Sep. 1, 2013), page • Evidence 36, Decision on Appeal for U.S. Appl. No. 10/575,554, dated Nov. 10, 2016, from the United States Patent and Trademark Office, Patent Trial and Appeal Board, 7 pages • Evidence 37;U.S. Patent Application Publication No. US2003/0184696, dated Oct. 2, 2003, 13 pages • Evidence 38. Abstracts of Japanese Patent Application Publication No. 2000-016808, published Jan. 18, 2000, with English translation of the specification, 15 pages.
Letter of Opponent/Appellant accompanying subsequent filed items, in European Patent No. 1783097 (European Application No. 05765549.0), filed Jun. 19, 2017, 10 pages.
Letter, dated Feb. 2, 2018, in Response to Opponent/Appellant's Response, dated Jun. 19, 2017, 8 pages.
Preliminary Opinion, Communication of the Board of Appeal pursuant to Article 15(1) of the Rules of Procedure of the Board of Appeal, dated May 7, 2018, for European Patent No. 1783097 (European Application No. 05765549.0), , case No. T 0287/16-3.3.05, 10 pages.
Letter of Opponent/Appellant accompanying subsequent filed items, in European Patent No. 1783097 (European Application No. 05765549.0), filed Jun. 8, 2018, and acknowledgement of receipt dated Jun. 14, 2018, including • Grafoil Flexible Graphite, Graftech Engineering Design Manual, $2^{nd}$ Edition, Mark Pollock (ed.), copyright 2002, 117 pages.
Decision of the Technical Board of Appeal, dated Jul. 12, 2018, for European Patent Application No. 05765549.0, European Patent No. EP1783097, case No. T 0287/16-3.3.05.

| | | rolling speed (m/min) | | | | | |
|---|---|---|---|---|---|---|---|
| | | 1 | 2 | 4 | 6 | 8 | 10 |
| creases | | no creases | no creases | creases | creases | creases | creases |
| surface roughness center line average height Ra(μm) | | 2 | 3 | 5 | 6 | 6 | 6 |
| $\dfrac{\text{Max}-\text{Min}}{\text{Ave}} \times 100\ (\%)$ | | 5 | 8 | 14 | 14 | 22 | 30 |

Fig.3

EXPANDED-GRAPHITE SHEET

This application is a continuation of U.S. patent application Ser. No. 10/575,554, filed Apr. 10, 2006, which is a U.S. National Phase under 35 U.S.C. § 371 of International Application No. PCT/JP2005/012733, filed Jul. 11, 2005, which claims priority of Japanese Patent Application 2004-249137 filed Aug. 27, 2004.

TECHNICAL FIELD

This invention relates to a thermally anisotropic expanded-graphite sheet whose thermal conductivity in its surfacewise directions is higher than that in its thicknesswise directions.

BACKGROUND OF THE INVENTION

Thermally anisotropic sheets whose thermal conductivity in their surfacewise directions (hereinafter referred to as "thermal conductivity in parallel direction") is higher than that in their thicknesswise directions (hereinafter referred to as "thermal conductivity in perpendicular direction") have been used to conduct heat from heat sources to other places. The higher the thermal conductivity in parallel direction of a sheet is, the quicker the thermal conduction through it is; accordingly, sheets of high thermal conductivity in parallel direction have been developed.

Disclosed in the Japanese Unexamined Patent Publication No. 2001-79977 is a graphite sheet of high thermal conductivity in parallel direction. This graphite sheet is made by heat-treating a film of a polymer such as polyimide over 2,400° C., and its thermal conductivity in parallel direction is as high as 500-800 W/(m·K). However, such polymer films are costly. Besides, heat-treating of such polymer films takes a long time; therefore, the production efficiency of the graphite sheet is low. Accordingly, the graphite sheet is very costly and, hence, the application of the graphite sheet to apparatuses and equipment is limited.

Although the thermal conductivity in parallel direction of the graphite sheet of the above Japanese Unexamined Patent Publication No. 2001-79977 is very high, its thermal conductivity in parallel direction is not uniform if its thickness or density is not uniform. When it is used to conduct heat from a heat source to other places, spots of low thermal conductivity becomes heat spots which affect nearby components or devices. However, no method of preventing such heat spots from being made is disclosed in the Japanese Unexamined Patent Publication No. 2001-79977.

SUMMARY OF THE INVENTION

Accordingly, the present invention provides an expanded-graphite sheet whose thermal conductivity in parallel direction is uniform and higher than its thermal conductivity in a perpendicular direction and which can be produced efficiently at relatively low cost.

According to a first feature of the present invention, there is provided an expanded-graphite sheet whose thermal conductivity in parallel direction is 350 W/(m·K) or more.

According to a second feature of the present invention, there is provided the expanded-graphite sheet according to the first feature. The arithmetic mean surface roughness of the expanded-graphite sheet is less than 5 µm.

According to a third feature of the present invention, there is provided the expanded-graphite sheet according to the first or second feature. The difference between the highest and lowest values of local thermal conductivities at various spots on the expanded-graphite sheet is 10% or less of its overall mean thermal conductivity.

According to a fourth feature of the present invention, there is provided the expanded-graphite sheet according to the first, second, or third feature. The electromagnetic-wave-shielding effect of the expanded-graphite sheet in the frequency range of 100-800 MHz is 60 dBµV/m or more.

According to a fifth feature of the present invention, there is provided the expanded-graphite sheet according to the first, second, third, or fourth feature. The total impurity content of the expanded-graphite sheet is 10 ppm or less.

According to a sixth feature of the present invention, there is provided the expanded-graphite sheet according to the first, second, third, fourth, or fifth feature. The bulk density of the expanded-graphite sheet is 1.6 Mg/m$^3$ or more.

An advantage offered by the first feature of the present invention is as follows: Because the thermal conductivity in parallel direction of the expanded-graphite sheet is 350 W/(m·K) or more, surfacewise thermal conduction through the sheet is quick; therefore, the expanded-graphite sheet is suitable for the conduction and diffusion of heat. Especially if the expanded-graphite sheet is made of expanded graphite alone, its thermal conductivity in parallel direction can be made much higher than its thermal conductivity in a perpendicular direction; therefore, it is more suitable for the conduction and diffusion of heat. If the expanded-graphite sheet is made by compressing with a rolling mill or the like expanded graphite which is made by heating and forming graphite soaking up liquid such as sulfuric acid, no heat treatment in particular is required and, hence, the expanded-graphite sheet can be produced easily in a short time. If the expanded-graphite sheet is produced with a rolling mill, the expanded-graphite sheet can be produced continuously; therefore, the expanded-graphite sheet can be produced efficiently. If the expanded-graphite sheet is made of expanded graphite alone, the raw-material cost of the expanded-graphite sheet is relatively low and, hence, the expanded-graphite sheet can be produced at relatively low cost.

An advantage offered by the second feature of the present invention is as follows. Because the arithmetic mean surface roughness of the expanded-graphite sheet is less than 5 µm, its thermal conductivity is relatively uniform; accordingly, no heat spot is made on it while heat is conducted and diffused through it.

An advantage offered by the third feature of the present invention is as follows. Because the thermal conductivity of the expanded-graphite sheet is relatively uniform, no heat spot is made on it while heat is conducted and diffused through it.

An advantage offered by the fourth feature of the present invention is as follows. The expanded-graphite sheet is suitable not only for conducting heat from heat sources to other places but also for shielding objects from electromagnetic waves.

An advantage offered by the fifth feature of the present invention is as follows. Because the total impurity content of the expanded-graphite sheet is as low as 10 ppm or less, components and devices fitted with the expanded-graphite sheet are prevented from deteriorating due to impurities.

An advantage offered by the sixth feature of the present invention is as follows. Because the entanglement of graphite fibers of the expanded-graphite sheet is firm and, hence, the graphite fibers are firmly bonded together, the expanded-graphite sheet is strong and does not easily tear.

DETAILED DESCRIPTION OF THE INVENTION

The present invention provides an expanded-graphite sheet which is made substantially of expanded graphite alone by compressing it.

The expanded graphite may contain a certain amount (for example, 5% or so) of binder such as phenol resin or rubber. It is preferable, however, for the expanded graphite to contain no binder, because expanded graphite containing no binder is more suitable for the production of expanded-graphite sheets of high thermal conductivity and high heat resistance.

The word of "expanded graphite" used hereinafter means both the cases of containing and not containing binder.

The expanded-graphite sheet of the present invention is made by compressing cotton wool-like expanded graphite consisting of entangled fibrous graphite. The graphite fibers of the expanded-graphite sheet are put in the surfacewise directions of the sheet (in the directions perpendicular to the directions of compression) and piled up from the bottom surface to the top surface of the sheet; therefore, the thermal conductivity in parallel direction of the expanded-graphic sheet is higher than its thermal conductivity in perpendicular direction. The expanded-graphite sheet is higher than its thermal conductivity in perpendicular direction. The expanded-graphite sheet of the present invention is made so that its thermal conductivity in parallel direction will be 350 W/(m·K) or more. Because the thermal conductivity in parallel direction of the expanded-graphite sheet is much higher than its thermal conductivity in perpendicular direction, it is suitable for the conduction and diffusion of heat. If its thermal conductivity in parallel direction is less than 350 W/(m·K), the difference between its thermal conductivities in parallel direction and in perpendicular direction is small and its surfacewise thermal diffusion is insufficient; therefore, the thermal conductivity in parallel direction of the expanded-graphite sheet of the present invention needs to be 350 W/(m·K) or more. It is desirable if the thermal conductivity in parallel direction of the expanded-graphite sheet is 380 W/(m·K) or more and it is more desirable if the thermal conductivity in parallel direction of the expanded-graphite sheet is 400 W/(m·K) or more, because the difference between its thermal conductivities in parallel direction and in perpendicular direction is larger. Even if the expanded-graphite sheet is thin, the difference between its thermal conductivities in parallel direction and in perpendicular direction is large enough and, hence, the expanded-graphite sheet is still suitable for the surfacewise thermal diffusion.

Besides, the bulk density of the expanded-graphite sheet of the present invention is as high as 1.6-2.1 Mg/m³. Accordingly, the entanglement of graphite fibers is firm and, hence, they are firmly bonded together; therefore, the expanded-graphite sheet is strong and does not easily tear.

Moreover, because the bulk density of the expanded-graphite sheet of the present invention is high as mentioned above, its electromagnetic-wave-shielding effect is excellent. The electromagnetic-wave-shielding effect was measured by the KEC method developed by the Kansai Electronic Industry Development Center (KEC). The result was the electromagnetic-wave-shielding effect of 60 dBµV/m or more in the frequency range of 100-800 MHz. Thus, the expanded-graphite sheet of the present invention is suitable not only for conducting heat from heat sources to other places but also for shielding objects from electromagnetic waves.

If the thickness and bulk density of the expanded-graphite sheet are increased, its electromagnetic-wave-shielding effect increases. If electromagnetic-wave-shielding effect of 60 dBµV/m or more in the frequency range of 100-800 MHZ is required, the thickness of 0.1-3.0 mm and the bulk density of 1.0-2.1 Mg/m³ will do. If electromagnetic-wave-shielding effect of 40 dBµV/m or more in the frequency range of 100-800 MHz is required, the thickness of 0.1-3.0 mm and the bulk density of 0.5-2.1 Mg/m³ will do.

Furthermore, the arithmetic mean of surface roughness of the expanded-graphite sheet of the present invention in accordance with JIS B0601-2001 is less than 5 µm, and its surface roughness is relatively uniform. Accordingly, its thermal conductivity is relatively uniform and, hence, the diffusion of heat is relatively uniform. Therefore, no heat spot is made on the expanded-graphite sheet. It will do if the difference between the highest and lowest values of local thermal conductivities at various spots on the expanded-graphite sheet is 10% or less of the mean conductivity of the expanded-graphite sheet.

A method of making the expanded-graphite sheet of the present invention will be described below.

Figure 1:
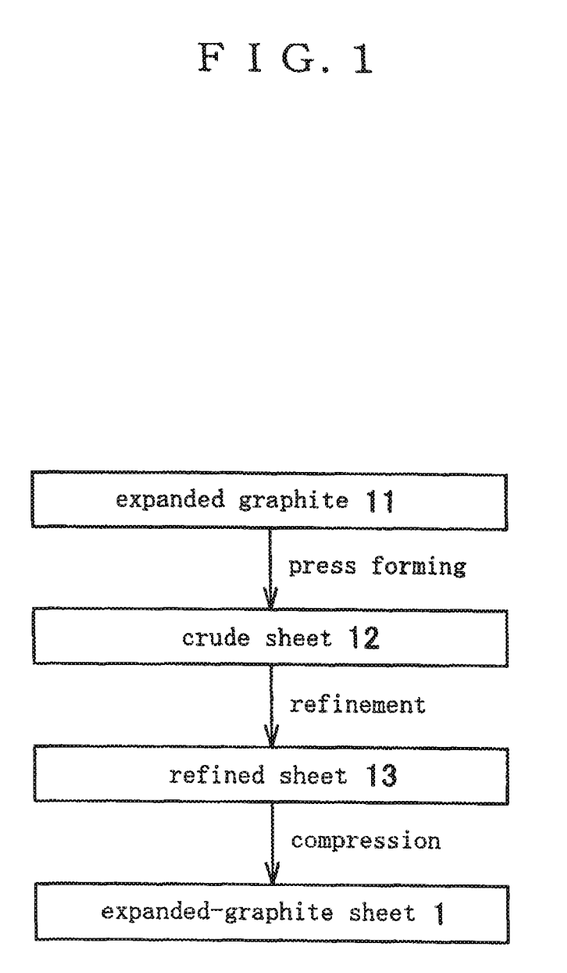
FIG. 1 is a flowchart of the process of making the expanded-graphite sheet of the present invention.

FIG. 1 is a flowchart of the process of making the expanded-graphite sheet 1 of the present invention.

Expanded graphite 11 is sheet-like material of cotton wool-like graphite (expanded graphite) which is made by soaking natural or kish graphite in a liquid such as sulfuric or metric acid and then heat-treating the graphite over 400° C.

The expanded graphite 11 has the thickness of 1.0-30.0 mm and the bulk density of 0.1-0.5 Mg/m³. A crude sheet 12 is made by compressing the expanded graphite 11 down to the thickness of 0.1-3.0 mm and up to the bulk density of 0.8-1.0 Mg/m³.

If expanded graphite 11 of the thickness of 2.0 mm and the bulk density of 0.1 Mg/m³ is compressed into a crude sheet 12 of the thickness of 0.2 mm and the bulk density of 1.0 Mg/m³, bubbles are not formed during the compression and, hence, a homogeneous crude sheet 12 is made. Then, an expanded-graphite sheet 1 of uniform thermal conductivity can be made from the homogeneous crude sheet 12.

Expanded graphite 11 may be compressed into a crude sheet 12 with a press or rolling mill. If a rolling mill is used, the crude sheet 12 can be produced efficiently Next, impurities such as sulfur and iron are removed from the crude sheet 12 by using a halogen gas or the like to make a refined sheet 13 whose total impurity content is 10 ppm or less and, especially, whose sulfur content is 1 ppm or less.

If a refined sheet 13 whose total impurity content is 5 ppm or less is compressed into an expanded-graphite sheet 1, the deterioration of components and devices fitted with the expanded-graphite sheet 1 is prevented without fail.

Instead of the above method of removing impurities from the crude sheet 12, any optimum method may be adopted in accordance with the thickness and bulk density of the crude sheet 12.

The refined sheet 13 is compressed into an expanded-graphite sheet 1 whose thickness and bulk density are 0.05-1.5 mm and 1.6-2.1 $Mg/m^3$.

The refined sheet 13 may be compressed with a press or rolling mill. If it is compressed with a rolling mill, the expanded-graphite sheet 1 can be produced efficiently.

Expanded graphite 11 of the thickness of 1.0-30.0 mm and the bulk density of 0.1-0.5 $Mg/m^3$ is usually compressed into a crude sheet 12 of 0.1-30.0 mm and the bulk density of 0.1-0.5 $Mg/m^3$. Then, the crude sheet 12 (or refined sheet 13) of the thickness of 0.1-3.0 mm and the bulk density of 0.8-1.0 $Mg/m^3$ is usually compressed with a rolling mill at a rolling speed less than 3 m/min into an expanded-graphite sheet 1 of the thickness of 0.05-1.5 mm and the bulk density of 1.6-2.1 $Mg/m^3$. If the rolling speed is 3 m/min or more, creases are formed on the surfaces of the expanded-graphite sheet 1 and the precision of the surfaces of the expanded-graphite sheet 1 is reduced. The thermal conductivity of the creased parts is reduced and the heat radiation from the surfaces of the creased parts is reduced.

The inventors of the present invention found that the expanded-graphite sheet 1 is free of creases and the smoothness of the surfaces of the expanded-graphite sheet 1 improves if a refined sheet 13 of the thickness of 0.1-3.0 mm and the bulk density of 0.8-1.0 $Mg/m^3$ is compressed with a rolling mill at a rolling speed less than 3 m/min into an expanded-graphite sheet 1 of the thickness of 0.05-1.5 mm and the bulk density of 1.6-2.1 $Mg/m^3$.

Namely, by compressing a refined sheet 13 at a rolling speed less than 3 m/min, an expanded-graphite sheet 1 of the thickness of 0.05-1.5 mm, the bulk density of 1.6-2.1 $Mg/m^3$, even thermal conductivity, and the surface smoothness of 5 μm or less is produced. It is more desirable if the rolling speed is set at 1-2 m/min, because expanded-graphite sheets 1 of the above quality can be produced without reducing the productivity.

It is preferable if the thickness and bulk density of the expanded-graphite sheet 1 are 0.1-0.5 mm and 1.6 $Mg/m^3$ or more, because the expanded-graphite sheet 1 has high thermal conductivity, high electric conductivity, and excellent electromagnetic-wave-shielding effect on the one hand and the production cost and the fraction defective of the expanded-graphite sheet 1 are held down on the other hand. It is more desirable if the bulk density of the expanded-graphite sheet 1 is 1.75 $Mg/m^3$ or more, because the thermal and electric conductivities and the electromagnetic-wave-shielding effect of the expanded-graphite sheet 1 are further improved on the one hand and the strength of the expanded-graphite sheet 1 is improved on the other hand. It is most desirable if the bulk density of the expanded-graphite sheet 1 is 1.81 $Mg/m^3$ or more, because the thermal and electric conductivities and the electromagnetic-wave-shielding effect of the expanded-graphite sheet 1 is further improved on the other hand.

It is preferable especially if a refined sheet 13 of the thickness of 0.2 mm and the bulk density of 1.0 $Mg/m^3$ is compressed into an expanded-graphite sheet 1 of the thickness of 0.1 mm and the bulk density of 1.9 $Mg/m^3$, because (i) the thermal and electric conductivities and the electromagnetic-wave-shielding effect of the expanded-graphite sheet 1 are high, (ii) the expanded-graphite sheet 1 occupies a relatively small space, and (iii) the expanded-graphite sheet 1 can easily be produced at a relatively low cost.

Because the expended-graphite sheet 1 can be produced through only the steps of compression and refinement, it can be produced efficiently at a low cost. The production efficiency of the expanded-graphite sheet 1 can be further improved especially if the refined sheet 13 is compressed into an expanded-graphite sheet 1 with a rolling mill.

The crude sheet 12 may be compressed directly into an expanded-graphite sheet 1, skipping over the step of refinement.

First Embodiment

The thermal conductivities in parallel direction, electromagnetic-wave-shielding effect, and surface roughness of expanded-graphite sheets of the present invention were compared with those of expanded-graphite sheets currently in use. The expanded-graphite sheets of the present invention were made by compressing refined sheets at a rolling speed of 1-2 m/min and had the bulk density of 1.9 $Mg/m^3$. The expanded-graphite sheets currently in use were made by compressing refined sheets at rolling speeds of 3-10 m/min and had the bulk density of 1.0 $Mg/m^3$.

The thermal diffusivity of the expanded-graphite sheet was found by using the laser flash method and its thermal conductivity was calculated from the thermal diffusivity so found. Nine test pieces 25 mm by 25 mm were cut off from the 200-by-200 mm expanded-graphite sheet, and the mean thermal conductivity of the nine test pieces was calculated.

The electromagnetic-wave-shielding effect of the expanded-graphite sheet was measured by using electromagnetic waves of 0-1,000 MHz and the KEC method.

As to the surface roughness of the expanded-graphite sheet, the center line average height (arithmetical mean deviation of profile in accordance with JIS B0601-2001) was measured by using a surface-roughness measuring apparatus (SURFCOM 473A made by Tokyo Seimitsu Co., Ltd.) and a probe with a 5-μm, 90° conical diamond tip of 0.8-mm cutoff. The measuring force was 4 mN (400 gf) or less.

The mean thermal conductivity of the nine test pieces of the expanded-graphite sheet of the present invention was as high as 400 W/(m·K), whereas that of the expanded-graphite sheet currently in use was 200 W/(m·K).

The difference between the highest and lowest thermal conductivities of the nine test pieces of the expanded-graphite sheet of the present invention was 30 W/(m·K), whereas that of the expanded-graphite sheet currently in use was 50 W/(m·K). Thus, the expanded-graphite sheet of the present invention proved itself to have relatively uniform thermal conductivity.

The mean and dispersion of the center line average heights of the nine test pieces of the expanded-graphite sheet of the present invention were 2 μm and ±1 μm, whereas those of the expanded-graphite sheet currently in use were 6 μm and ±2 μm. Thus, the expanded-graphite sheet of the present invention proved its surface quality to be relatively good and relatively uniform. This means that the thermal conductivity of the expanded-graphite sheet of the present invention is relatively uniform and relatively high.

Figure 2:
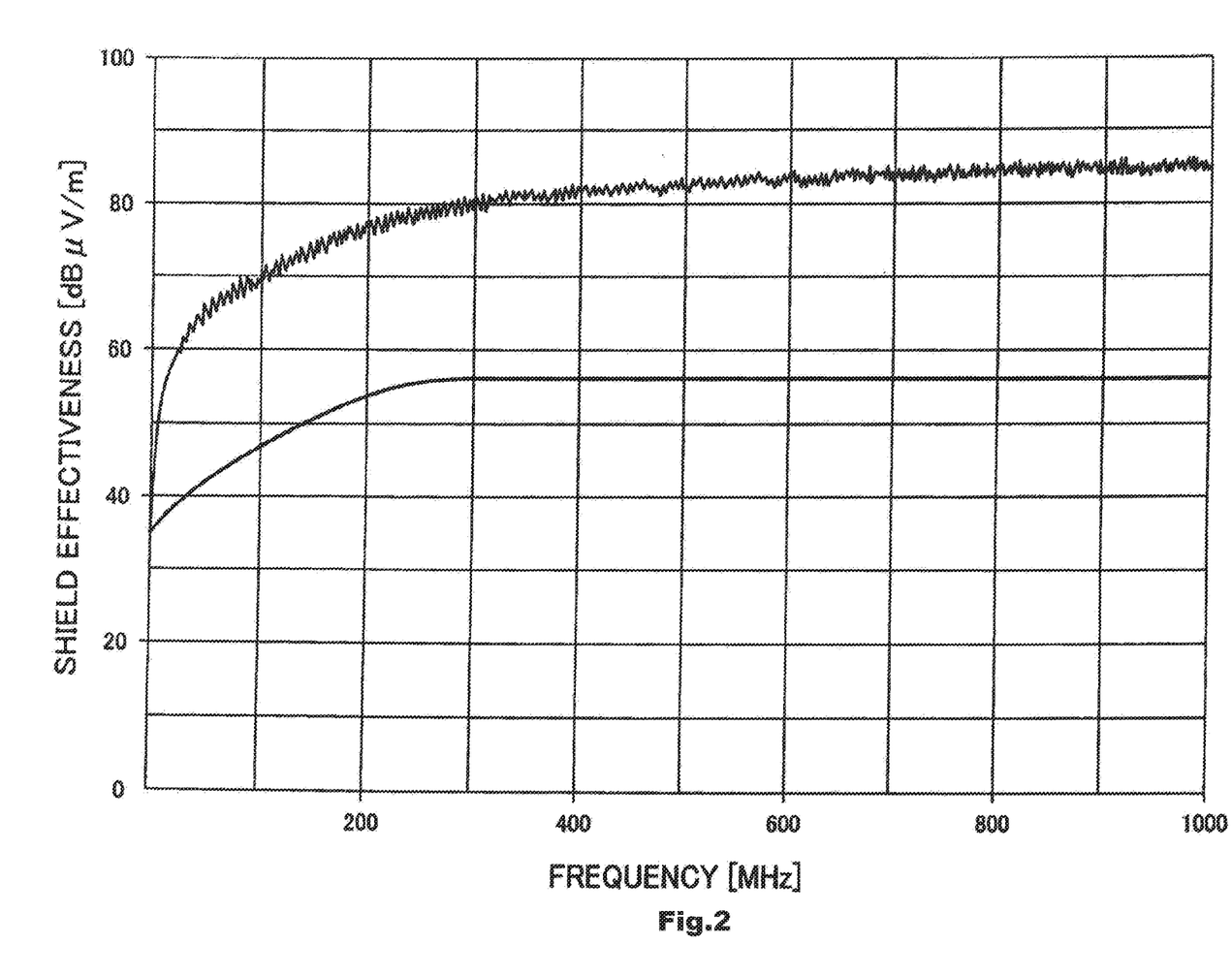
FIG. 2 is a plot comparing the electromagnetic-wave-shielding effect of the expanded-graphite sheet of the present invention with that of an expanded-graphite sheet currently in use.

In FIG. 2, the electromagnetic-wave-shielding effect of the expanded-graphite sheets of the present invention is compared with that of the expanded-graphite sheets currently in use. As shown in FIG. 2, the expanded-graphite sheets of the present invention have electromagnetic-wave-shielding effect of 60 dBμV/m or more in the frequency range of 100-800 MHz, whereas the expanded-graphite sheets currently in use have electromagnetic-wave-shielding effect of 50 dBμV/m or so in the same frequency range.

Thus, the expanded-graphite sheets of the present invention proved themselves to have relatively high electromagnetic-wave-shielding effect.

Second Embodiment

Refined sheets of the thickness of 1.0 mm and the bulk density of 1.0 Mg/m$^3$ were compressed into expanded-graphite sheets of the thickness of 0.5 mm and the bulk density of 1.9 Mg/m$^3$ in the rolling-speed range of 1-10 m/min to ascertain the effects of the rolling speed on the surface roughness, creases, and thermal conductivity of the expanded-graphite sheets.

As to the dispersion of thermal conductivity, nine test pieces were cut off from the expanded-graphite sheet of each of the rolling speeds of 1, 2, 4, 6, 8, and 10 m/min and the difference between the highest and lowest conductivities of the nine test pieces was divided by the mean conductivity of the nine test pieces.

Figure 3:
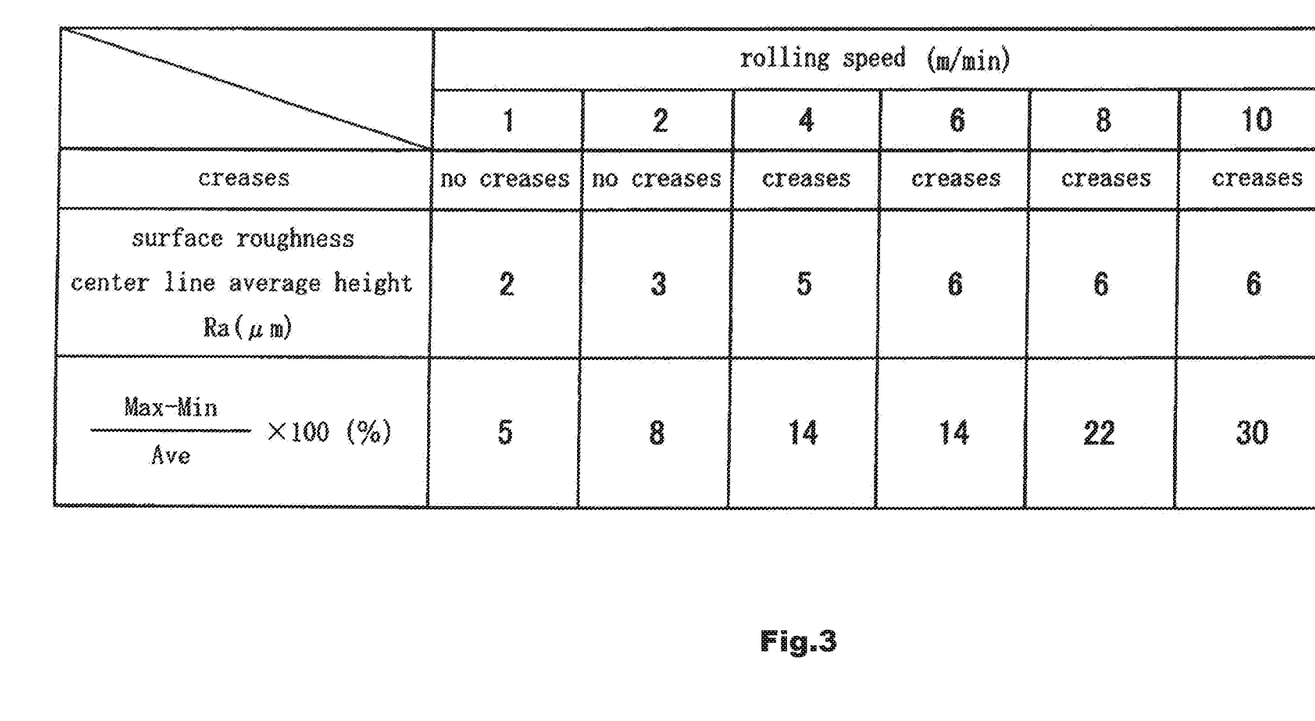
FIG. 3 is a table of surface conditions of expanded-graphite sheets made at various rolling speeds.

As shown in FIG. 3, as the rolling speed increased, the center line average height and the dispersion of thermal conductivity increased. When the rolling speed increased from 2 m/min to 4 m/min, the center line average height and the dispersion of thermal conductivity almost doubled. This indicates that the surface roughness affects the dispersion of thermal conductivity. On the other hand, no creases were formed on the surfaces of the expanded-graphite sheets at the speeds of 4 m/min and more. This suggests that creases affect the dispersion of thermal conductivity significantly.

When the rolling sped increased from 6 m/min to 8 m/min and to 10 m/min, the center line average height remained unchanged at the level of 6 μm on the one hand and the dispersion of thermal conductivity increased from 14% to 22% and to 30% on the other hand. The reason for the increase of the dispersion would be inadequate deaeration due to, and cracks caused by, high rolling speed.

The expanded-graphite sheet of the present invention is suitable for conducting and diffusing heat from heat sources in electronic devices such as portable telephones, shielding objects from electromagnetic waves, diffusing heat from heat spots, and so on.

What is claimed is:

1. An expanded-graphite sheet consisting of a single sheet of expanded-graphite, wherein a thermal conductivity of the expanded-graphite sheet is 350 W/(m·K) or more in a direction parallel to the surface of the expanded-graphite sheet, said expanded-graphite sheet having an arithmetic mean surface roughness of less than 5 μm.

2. The expanded-graphite sheet of claim 1 wherein the difference between the highest and lowest values of local thermal conductivities at various spots on the expanded-graphite sheet is 10% or less of the overall mean thermal conductivity thereof.

3. The expanded-graphite sheet of claim 1 having an electromagnetic-wave-shielding effect of 60 dB μV/m or more in the frequency range of 100-800 MHz.

4. The expanded-graphite sheet of claim 1 with a total impurity content of 10 ppm or less.

5. The expanded-graphite sheet of claim 1 with a bulk density of 1.6 Mg/m$^3$ or more.

6. The expanded-graphite sheet of claim 1, wherein the single sheet of expanded-graphite consists of:
expanded-graphite;
optionally a binder; and
optionally an impurity content.

7. An expanded-graphite sheet consisting of a single sheet of expanded-graphite, wherein a thermal conductivity of the expanded-graphite sheet is 350 W/(m·K) or more in a direction parallel to the surface of the expanded-graphite sheet, and wherein the difference between the highest and lowest values of local thermal conductivities at various spots on the expanded-graphite sheet is 10% or less of the overall mean thermal conductivity thereof.

8. The expanded-graphite sheet of claim 7 having an electromagnetic-wave-shielding effect of 60 dB μV/m or more in the frequency range of 100-800 MHz.

9. The expanded-graphite sheet of claim 7 with a total impurity content of 10 ppm or less.

10. The expanded-graphite sheet of claim 7 with a bulk density of 1.6 Mg/m$^3$ or more.

11. The expanded-graphite sheet of claim 7, wherein the single sheet of expanded-graphite consists of:
expanded-graphite;
optionally a binder; and
optionally an impurity content.

12. An expanded-graphite sheet made by a process comprising:
(i) compressing a single sheet of expanded graphite into a single crude sheet; and
(ii) compressing the single crude sheet, with a rolling mill operating at a rolling speed of less than 3 m/min, into the expanded-graphite sheet, the expanded-graphite sheet having a thickness of 0.05-1.5 mm, a bulk density of 1.6-2.1 Mg/m$^3$, and a thermal conductivity of 350 W/(m·K) or more in a direction parallel to the surface of the expanded-graphite sheet.

13. The expanded-graphite sheet of claim 12, wherein the expanded-graphite sheet has an arithmetic mean surface roughness of less than 5 μm, and a thermal conductivity dispersion of less than 10%.

14. The expanded-graphite sheet of claim 13, wherein the process further comprises removing impurities from the single crude sheet by halogen gas exposure to obtain a total impurity content of 5 ppm or less, including sulfur content of 1 ppm or less, prior to compressing the single crude sheet with the rolling mill.

15. An expanded-graphite sheet consisting of:
expanded-graphite; and
optionally an impurity content,
wherein a thermal conductivity of the expanded-graphite sheet is 350 W/(m·K) or more in a direction parallel to the surface of the expanded-graphite sheet, said expanded-graphite sheet having an arithmetic mean surface roughness of less than 5 μm.

16. The expanded-graphite sheet of claim 15 wherein the difference between the highest and lowest values of local thermal conductivities at various spots on the expanded-graphite sheet is 10% or less of the overall mean thermal conductivity thereof.

17. The expanded-graphite sheet of claim 15 having an electromagnetic-wave-shielding effect of 60 dBμV/m or more in the frequency range of 100-800 MHz.

18. The expanded-graphite sheet of claim 15 with a total impurity content of 10 ppm or less.

19. The expanded-graphite sheet of claim 15 with a bulk density of 1.6 Mg/m$^3$ or more.

20. An expanded-graphite sheet consisting of:
expanded-graphite; and
optionally an impurity content,
wherein a thermal conductivity of the expanded-graphite sheet is 350 W/(m·K) or more in a direction parallel to the surface of the expanded-graphite sheet, and
the difference between the highest and lowest values of local thermal conductivities at various spots on the expanded-graphite sheet is 10% or less of the overall mean thermal conductivity thereof.

21. The expanded-graphite sheet of claim 20 having an electromagnetic-wave-shielding effect of 60 dBµV/m or more in the frequency range of 100-800 MHz.

22. The expanded-graphite sheet of claim 20 with a total impurity content of 10 ppm or less.

23. The expanded-graphite sheet of claim 20 with a bulk density of 1.6 Mg/m$^3$ or more.

* * * * *